United States Patent [19]

Chang

[11] Patent Number: 5,366,589
[45] Date of Patent: Nov. 22, 1994

[54] BONDING PAD WITH CIRCULAR EXPOSED AREA AND METHOD THEREOF

[75] Inventor: Li-Hsin Chang, Chandler, Ariz.

[73] Assignee: Motorola, Inc., Schaumburg, Ill.

[21] Appl. No.: 152,355

[22] Filed: Nov. 16, 1993

[51] Int. Cl.[5] .................... B44C 1/22; C03C 15/00; C03C 25/06
[52] U.S. Cl. ............................. 156/657; 156/633; 156/644; 257/774; 257/784; 437/183; 437/203; 437/238; 437/241
[58] Field of Search .......... 156/633, 644, 657, 659.1, 156/662, 656; 437/175, 180, 183, 187, 203, 204, 228, 238, 241, 249; 257/737, 738, 774, 780, 784

[56] References Cited

U.S. PATENT DOCUMENTS 5,244,833  9/1993  Gansauge et al. ............ 437/203 X
5,266,446  11/1993  Chang et al. ................. 437/203 X Primary Examiner—William Powell
Attorney, Agent, or Firm—Robert D. Adkins

[57] ABSTRACT

A bonding pad is covered by an passivation layer to provide insulation and anti-corrosion protection. The passivation layer over the bonding pad is etched away to expose a circular area of the bonding pad where the bonding wire is attached. By shaping the passivation layer on top of the metal area in the form of a smooth curvature, there are no sharp edges. The circular exposed metal area minimizes the electric field density produced by application of a high voltage to the bonding pad and thereby avoids breakdown of the passivation layer.

15 Claims, 1 Drawing Sheet

BONDING PAD WITH CIRCULAR EXPOSED AREA AND METHOD THEREOF

BACKGROUND OF THE INVENTION

The present invention relates in general to bonding pads and, more particularly, to a bonding pad having a circular exposed area.

An integrated circuit typically contains metal channels for routing signals throughout the IC. To interconnect the IC circuitry to the outside world, most if not all ICs use bonding pads to connect the metal channels through bonding wires to the pins of the IC package. The bonding pad is disposed on top of the semiconductor substrate. The bonding pad is typically composed of aluminum with small portions of copper and/or silicon. A passivation layer comprising a glass material such as silicon oxide or nitride insulates the substrate and bonding pads from contamination, corrosion and other external environmental conditions. In the prior art, a square or rectangular portion of the passivation layer material is etched out exposing the bonding pad to make a point of contact for the bonding wire to adhere.

A common problem associated with bonding pads occurs in high voltage ICs. The high voltage ICs typically have high voltage bonding pads and associated metal channels, and low voltage metal channels. Although the passivation layer is by nature an insulator, it is possible to induce a sufficient potential across the passivation layer to breach through its dielectric and short the low voltage metal channel. The electric field formed by application of a high voltage, say 400 volts or more, to the high voltage bonding wire could cause a punch through of the passivation layer from the high voltage bonding pad to the low voltage metal channel thereby damaging the IC.

The problem has long been attributed to sharp perimeter corners of the rectangular bonding pad. Prior art solutions have involved increasing the distance between the high voltage bonding pad and the low voltage metal channel, or providing some type of protection circuitry, e.g. diode protection, between the high voltage bonding pad and the low voltage metal channel. Yet punch through problems continue to plague many high voltage ICs.

DETAILED DESCRIPTION OF THE PREFERRED EMBODIMENT

Figure 1:
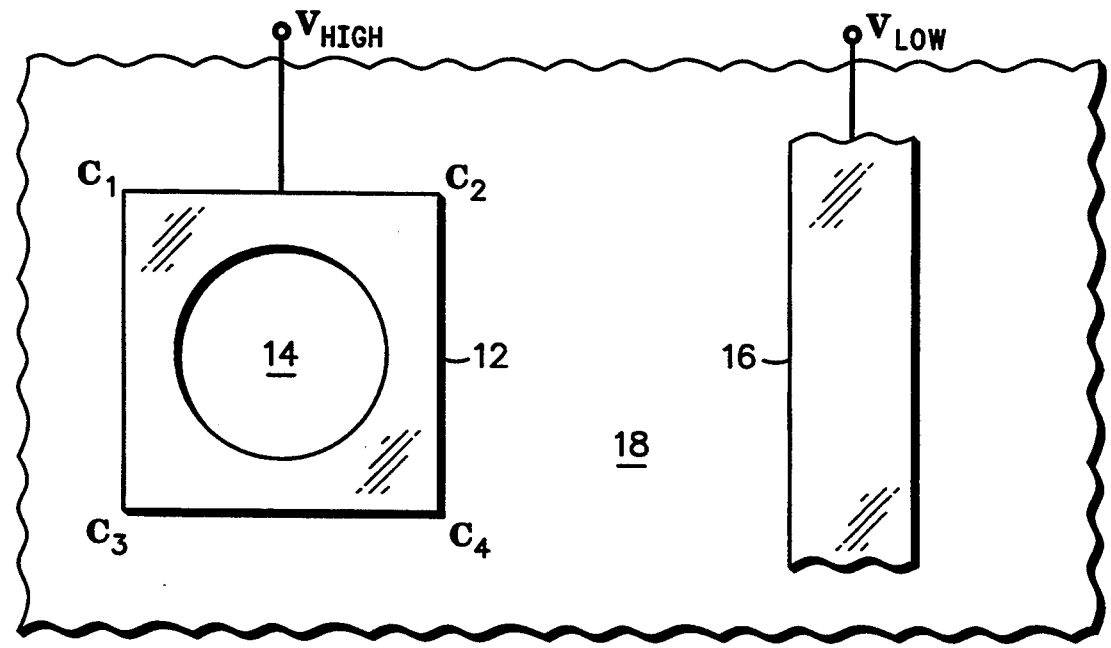
FIG. 1 is top view of a bonding pad.

A top view of IC 10 is shown in FIG.1 with bonding pad 12. There are a number of bonding pads like 12 on IC 10. Bonding pad 12 receives a high voltage input signal $V_{HIGH}$ and routes the high voltage signal via metal channels to high voltage circuitry in the IC (not shown). Bonding pad 12 may be composed of aluminum with small additional amounts of copper and/or silicon, and located on any specified area of IC 10. A low voltage metal channel 16 receives a low voltage signal $V_{LOW}$ and routes the low voltage signal through IC 10. A passivation layer 18 is disposed on top of bonding pad 12 and metal channel 16 for providing insulation and protection from external conditions such as dust and corrosion. Passivation layer 18 may comprise a glass material such as silicon oxide or nitride. A circular exposed area 14 is etched away from passivation layer 18 using conventional integrated circuit manufacturing processes to expose a smooth curvature for bonding pad 12.

Figure 2:
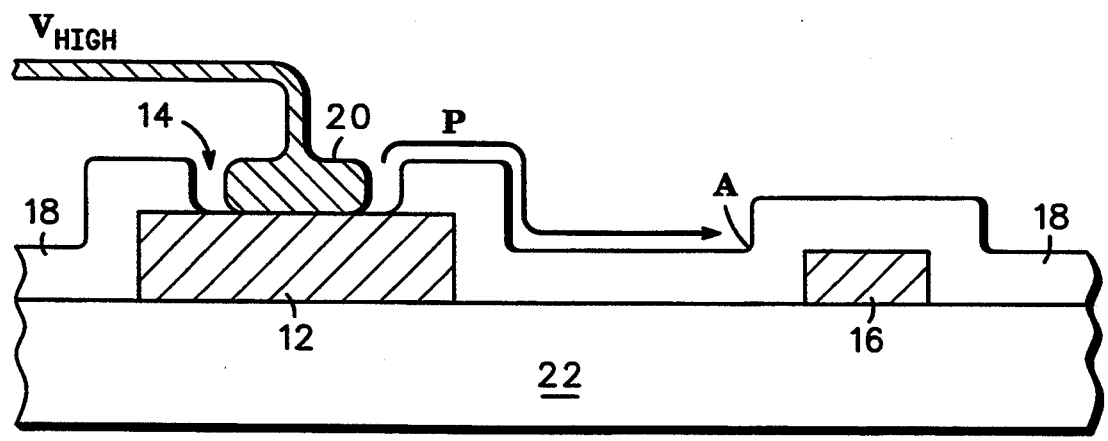
FIG. 2 is cross-sectional view of the bonding pad.

A cross-sectional view of IC 10 is shown in FIG. 2. Components in FIG. 2 having the same reference numbers used in FIG. 1 follow the same construction and perform the same function. A substrate 22 may comprise stacked layers of insulating materials suitable for building metal layers on. The metal layers are subsequently deposited on substrate 22 and patterned into bonding pad 12 and metal channel 16 through conventional integrated circuit processes. Bonding pad 12 is laid out through conventional CAD (computer aided design) process to provide desired layout shapes and structures for the device. Bonding pad 12 and metal channel 16 are covered with passivation layer 18.

The circular shaped area of passivation layer 18 is removed above bonding pad 12 so that metal is exposed for wire bonding. The removal of the passivation material in the desired area is accomplished through conventional photolithography and etching processes. A ball shaped wire bond 20 is fit onto exposed area 14 and affixed to bonding pad 12. The high voltage input signal $V_{HIGH}$, say 700 volts, is applied through wire bond 20 to bonding pad 12.

The high voltage produces an electric field in and around bonding pad 12 creating a large voltage differential between bonding pad 12 and metal channel 16. It is well known that the electrical field strength is highest at the corners of a conducting material, e.g. points $C_1$, $C_2$, $C_3$ and $C_4$ shown in FIG. 1, due to its high electron charge density. The passivated metal corners $C_1$–$C_4$ are normally protected by passivation layer 18 with its high breakdown strength. However, the exposed metal area 14 is poorly protected by other material such as the molding compound of the IC package having a relatively low breakdown strength and integrity.

If the electrical field exceeds the field strength of passivation layer 18, electrons will flow between bonding pad 12 and metal channel 16. The typical path follows the surface of passivation layer 18 along path P to point A as shown in FIG. 2 where a punch through occurs to metal channel 16. Thus, a sufficiently high electric field will punch through passivation layer 18 to metal channel 16 causing IC 10 to fail.

A key feature of the present invention is the discovery that the key path to protect is not from corners $C_1$–$C_4$ to metal channel 16, but rather from exposed area 14 along path P on the surface of passivation layer 18 through point A to metal channel 16. The exposed area 14 is etched away from passivation layer 18 in the shape of a circle to minimize the electric field density. The connection between passivation layer 18 and bonding pad 12 is also rounded to avoid sharp corners. By eliminating any sharp corners in and around exposed area 14, the electric field emanating from exposed area 14 is minimized by evenly distributing the electron charges thereabout. Thus, by making exposed area 14 circular in shape with no sharp corners, IC 10 becomes less susceptible to premature breakdown. Other smooth curvature shapes may also be used for exposed area 14 to reduce effects from the electric field.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A bonding pad, comprising:
   a metal area coupled for receiving a high voltage input signal;
   a passivation layer disposed on top of said metal area for providing insulation, said passivation layer being shaped to create an exposed portion of said metal area having a smooth curvature; and
   a bonding wire coupled to said exposed portion of said metal area for receiving said high voltage input signal.

2. The bonding pad of claim I wherein said exposed portion of said metal area is circular in shape.

3. The bonding pad of claim 2 wherein said metal area is made of aluminum.

4. The bonding pad of claim 3 wherein said passivation layer is made of oxide.

5. The bonding pad of claim 3 wherein said passivation layer is made of nitride.

6. A method of bonding to a pad, comprising the steps of:
   providing a metal area for receiving a high voltage input signal;
   disposing a passivation layer on top of said metal area for providing insulation;
   shaping said passivation layer on top of said metal area to create an exposed portion of said metal area having a smooth curvature; and
   attaching a bonding wire to said exposed portion of said metal area for receiving said high voltage input signal.

7. The method of claim 6 wherein said shaping step includes the step of etching said passivation layer in a circular form.

8. The method of claim 7 further including forming said metal area with aluminum.

9. The method of claim 8 further including forming said passivation layer with oxide.

10. The method of claim 8 further including forming said passivation layer with nitride.

11. A bonding pad, comprising:
    a metal area coupled for receiving a high voltage input signal;
    a passivation layer disposed on top of said metal area for providing insulation, said passivation layer being shaped to create a circular exposed portion of said metal area; and
    a bonding wire coupled to said circular exposed portion of said metal area for receiving said high voltage input signal.

12. The bonding pad of claim 11 wherein said metal area is made of aluminum.

13. The bonding pad of claim 12 wherein said metal area further includes copper.

14. The bonding pad of claim 12 wherein said passivation layer is made of oxide.

15. The bonding pad of claim 12 wherein said passivation layer is made of nitride.

* * * * *